(12) United States Patent
Takagi (10) Patent No.: US 9,357,644 B2
(45) Date of Patent: *May 31, 2016

(54) JOINED STRUCTURAL BODY OF MEMBERS, JOINING METHOD OF MEMBERS, AND PACKAGE FOR CONTAINING AN ELECTRONIC COMPONENT

(71) Applicant: KABUSHIKI KAISHA TOSHIBA, Minato-ku (JP)

(72) Inventor: Kazutaka Takagi, Kanagawa-ken (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/524,282

(22) Filed: Oct. 27, 2014

(65) Prior Publication Data

US 2015/0043186 A1    Feb. 12, 2015

Related U.S. Application Data

(62) Division of application No. 13/558,765, filed on Jul. 26, 2012, now abandoned.

(30) Foreign Application Priority Data

Oct. 26, 2011    (JP) .................. 2011-235385

(51) Int. Cl.
*H01L 23/047* (2006.01)
*H05K 1/09* (2006.01)
(Continued)

(52) U.S. Cl.
CPC ................ *H05K 1/09* (2013.01); *H01L 23/047* (2013.01); *H01L 23/10* (2013.01); *H05K 1/115* (2013.01);
(Continued)

(58) Field of Classification Search
CPC ...... H01L 23/047; H01L 23/10; H01L 23/057; H01L 23/3733; H01L 23/3735; H01L 23/66; H01L 24/49; H01L 23/3675; H01K 1/115; H01K 1/09

See application file for complete search history.

(56) References Cited

U.S. PATENT DOCUMENTS 4,784,974 A * 11/1988 Butt ............................... 29/827
5,155,299 A * 10/1992 Mahulikar et al. ............ 174/536

(Continued)

FOREIGN PATENT DOCUMENTS

CN    101555557 A    10/2009
CN    101681888 A    3/2010
(Continued)

OTHER PUBLICATIONS

European Office Action issued Jan. 12, 2016 in Patent Application 12178910.1.

(Continued)

*Primary Examiner* — Jarrett Stark
*Assistant Examiner* — Bitew Dinke
(74) *Attorney, Agent, or Firm* — Oblon, McClelland, Maier & Neustadt, L.L.P.

(57) ABSTRACT

According to one embodiment, a joined structural body for mounting an electronic component on the body which is provided with a first member, a second member and a joining portion. The joining portion is provided between the first member and the second member so as to connect the first member and the second member with each other mechanically. The joining portion contains at least one metal of a tin, an indium or a zinc, and a copper. The content of the metal in the joining portion decreases toward a side of at least one of the first member and the second member, and the content of the copper in the joining portion increases in the same direction as the decreasing direction of the content of the metal.

10 Claims, 9 Drawing Sheets (51) Int. Cl.
*H01L 23/10* (2006.01)
*H05K 1/11* (2006.01)
*H01L 23/66* (2006.01)

(52) U.S. Cl.
CPC ....... *H01L 23/66* (2013.01); *H01L 2224/48105* (2013.01); *H01L 2224/48157* (2013.01); *H01L 2224/49175* (2013.01); *H01L 2924/01327* (2013.01); *H01L 2924/13062* (2013.01); *H01L 2924/13091* (2013.01); *H01L 2924/3011* (2013.01); *Y10T 428/12458* (2015.01)

(56) References Cited

U.S. PATENT DOCUMENTS

| | | | |
|---|---|---|---|
| 5,218,230 A * | 6/1993 | Tamamura et al. | 257/691 |
| 6,241,145 B1 | 6/2001 | Maeda et al. | |
| 6,271,579 B1 * | 8/2001 | Going et al. | 257/664 |
| 6,365,961 B1 * | 4/2002 | Tomie | 257/664 |
| 6,755,958 B2 | 6/2004 | Datta | |
| 8,381,964 B2 | 2/2013 | Liu et al. | |
| 9,013,034 B2 * | 4/2015 | Takagi | 257/703 |
| 9,041,190 B2 * | 5/2015 | Takagi | 257/700 |
| 2002/0045330 A1 | 4/2002 | Angst et al. | |
| 2002/0090756 A1 | 7/2002 | Tago et al. | |
| 2004/0266048 A1 | 12/2004 | Platt et al. | |
| 2005/0218525 A1 | 10/2005 | Takahashi et al. | |
| 2005/0242419 A1 | 11/2005 | Philliber | |
| 2006/0139903 A1 * | 6/2006 | Takagi | 361/764 |
| 2007/0042211 A1 | 2/2007 | Love et al. | |
| 2008/0176096 A1 | 7/2008 | Cheng | |
| 2010/0091477 A1 * | 4/2010 | Takagi et al. | 361/820 |
| 2010/0193801 A1 * | 8/2010 | Yamada | B23K 35/282 257/77 |
| 2010/0247955 A1 * | 9/2010 | Takahashi et al. | 428/647 |
| 2010/0276039 A1 | 11/2010 | Guo et al. | |
| 2011/0132656 A1 | 6/2011 | Horiguchi et al. | |
| 2011/0223718 A1 | 9/2011 | Ikeda et al. | |
| 2011/0233750 A1 | 9/2011 | Trautmann et al. | |
| 2011/0233792 A1 | 9/2011 | Zhang et al. | |
| 2011/0291282 A1 | 12/2011 | Yamada et al. | |
| 2012/0032190 A1 * | 2/2012 | Takagi | 257/77 |
| 2012/0138954 A1 * | 6/2012 | Takagi | 257/77 |
| 2012/0321907 A1 | 12/2012 | Hoivik et al. | |
| 2013/0043594 A1 | 2/2013 | Sasaki et al. | |
| 2014/0063757 A1 * | 3/2014 | Takagi | 361/752 |

FOREIGN PATENT DOCUMENTS

| | | |
|---|---|---|
| EP | 2 157 605 A1 | 2/2010 |
| EP | 2 259 307 A2 | 12/2010 |
| EP | 2 363 373 A1 | 9/2011 |
| JP | 2002-110726 A | 4/2002 |
| JP | 2005-32834 A | 2/2005 |
| JP | 2005-274560 A | 10/2005 |
| JP | 2006-13241 | 1/2006 |
| JP | 2010-50163 A | 3/2010 |
| KR | 10-1999-0069950 A | 9/1999 |
| KR | 10-2002-0027220 A | 4/2002 |
| WO | WO 2008/041350 A1 | 4/2008 |
| WO | WO 2008/149584 A1 | 12/2008 |

OTHER PUBLICATIONS

Chinese Office Action issued Dec. 3, 2014, in Chinese Patent Application No. 201210279989.5 (with English translation).
Korean Office Action issued Sep. 25, 2013 in Patent Application No. 10-2012-86056 with English Translation.
Office Action issued on Feb. 12, 2014 in the corresponding Korean Patent Application No. 10-2012-86056 (with English Translation).
Combined Office Action and Search Report issued May 8, 2014, in Taiwanese Patent Application No. 101127981 with English translation and English translation of category of cited documents.
Yibo Rong et al: "Low temperature Cu—Sn bonding by isothermal solidification technology", Electronic Packaging Technology & High Density Packaging, 2009, ICEPT-HDP '09. International Conference on, IEEE, Piscataway, NJ, USA, Aug. 10, 2009, pp. 96-98, XP031533513, ISBN: 978 1-4244-4658-2.
Extended European Search Report issued on Jan. 20, 2014, in European Patent Application No. 12178910.1.
Office Action issued Sep. 30, 2013, in Japanese Patent Application No. 2011-235385 with English translation.
Combined Office Action and Search Report issued Jun. 15, 2015 in Chinese Patent Application No. 201210279989.5 (with partial English language translation and English translation of categories of cited documents).

* cited by examiner

JOINED STRUCTURAL BODY OF MEMBERS, JOINING METHOD OF MEMBERS, AND PACKAGE FOR CONTAINING AN ELECTRONIC COMPONENT

CROSS-REFERENCE TO RELATED APPLICATION

This application is a divisional of U.S. application Ser. No. 13/558,765 filed Jul. 26, 2012, and is based upon and claims the benefit of priority from the prior Japanese Patent Application No. 2011-235385, filed on Oct. 26, 2011, the entire contents of each of which are incorporated herein by reference.

FIELD

Embodiments described herein relate generally to a joined structural body of members, a method of joining members, and a package for containing an electronic component.

BACKGROUND

An electronic component, which is represented by a semiconductor element, is bonded to a substrate which supports the electronic component. The electronic component bonded to the substrate is mounted on another substrate such as a mounting board. Many of the electronic components are hermetically sealed within a package provided with a substrate in order to enhance the reliability of the electronic components. Such a substrate or a package needs to be stable against a temperature during bonding or operation of the electronic component. Accordingly, a plurality of members which constitute such a substrate or a package is joined using a silver solder having a melting point higher than a bonding temperature of the electronic component normally, for example.

In general, the substrate or the package is a complex which includes a circuit element for use of input/output of a signal or power supply from a power source, and a heat radiation element for radiating heat from an electronic component to outside. Members constituting such a complex may have different linear expansion coefficients. When the members are assembled by a silver solder under a high temperature, a warp or a strain is generated in the members due to the difference of the linear expansion coefficients of the members. The warp or strain deteriorates a characteristic of an electronic component, and lowers the reliability of the electronic component. Thus, it is needed to present a joined structural body of members and a method of joining members which are stable against a temperature during bonding or operation of an electronic component and can suppress warp and strain.

DETAILED DESCRIPTION

According to one embodiment, a joined structural body for mounting an electronic component on the body which is provided with a first member, a second member and a joining portion. The joining portion is provided between the first member and the second member so as to connect the first member and the second member with each other mechanically. The joining portion contains at least one metal of a tin, an indium or a zinc, and a copper. The content of the metal in the joining portion decreases toward a side of at least one of the first member and the second member, and the content of the copper in the joining portion increases in the same direction as the decreasing direction of the content of the metal.

Hereinafter, further embodiments will be described with reference to the drawings.

In the drawings, the same reference numerals denote the same or similar portions respectively.

A first embodiment will be described with reference to FIGS. 1A and 1B.

Figure 1A:
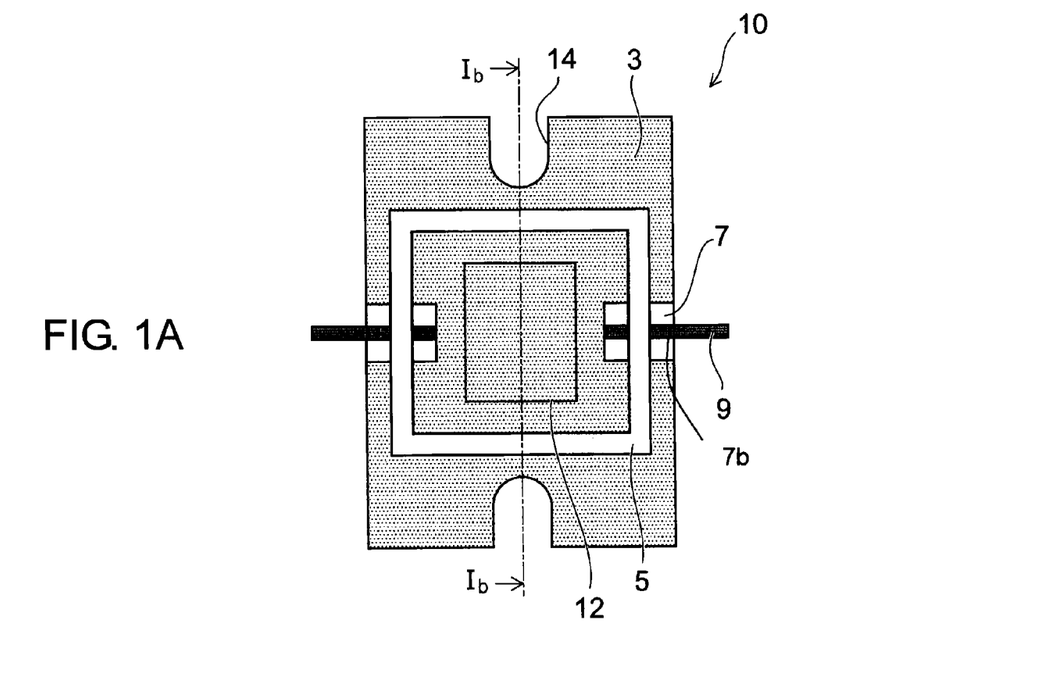
FIG. 1A is a schematic plan view illustrating a package according to a first embodiment.
Figure 1B:
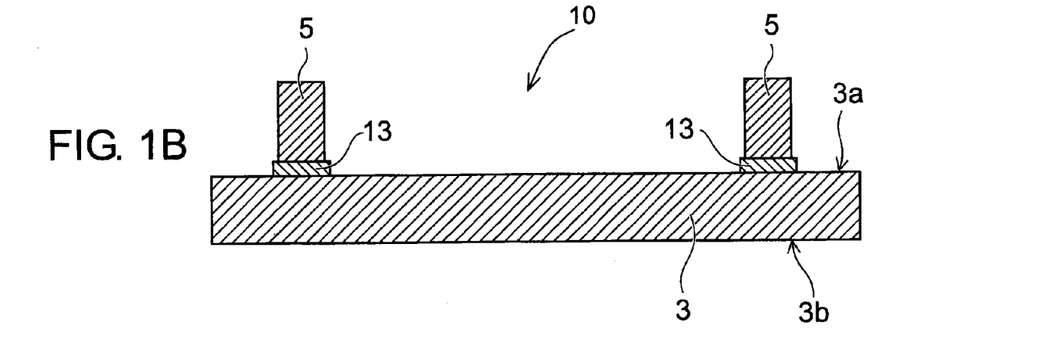
FIG. 1B is an enlarged cross-sectional view illustrating the package according to the first embodiment schematically.

FIGS. 1A and 1B are schematic views illustrating a package according to the first embodiment. FIG. 1A is a plan view of the package, and FIG. 1B is a cross-sectional view taken along Ib-Ib line in FIG. 1A. The package contains an electronic element such as a semiconductor element, an optical semiconductor element or a piezo-electric element.

In FIG. 1A, a package 10 is provided with a substrate 3 as a first member, a frame body 5 as a second member, two feed through terminals 7. The substrate 3 has a component mounting portion 12 and flange portions 14. The component mounting portion 12 is provided to mount an electronic component and a circuit element around the electronic component fixedly. The flange portions 14 are provided to fix the substrate 3 to a mount board using screws. A frame body 5 is arranged on the substrate 3 fixedly so as to surround the component mounting portion 12. The frame body 5 defines a boundary between the flange portions 14 and the component mounting portion 12.

The feed through terminals 7 are arranged between the substrate 3 and the frame body 5 in an up-and-down direction. The feed through terminals 7 are provided so as to connect an electronic component which is mounted on the component mounting portion 12 and is hermetically sealed in the package 10 with an external circuit electrically. Two leads 9 which are connected with the external circuit are respectively connected to the feed through terminals 7. An electronic component and strip lines 7b of the feed through terminals 7 can be respectively connected via wires (or conductive plates or ribbons).

As illustrated in FIG. 1B, the substrate 3 and the frame body 5 are connected via a joining portion 13. The substrate 3, the frame body 5, and the joining portion 13 constitute a joined structural body. It is emphasized that a package containing a power field effect transistor (power FET) for amplifying an electric power performs good heat dissipation. In consideration of heat dissipation, the substrate 3 is made of a metal having a high heat conductivity, such as copper (Cu) or an alloy of copper and molybdenum (Mo). On the other hand, the frame body 5 is required to have stiffness. Accordingly, the frame body 5 is made of a material such as a kovar i.e. an alloy which is produced by combining nickel (Ni) and cobalt (Co) with iron (Fe).

In manufacturing the package 10, an electronic component is bonded to a surface 3a (a component mounting portion 12) of the substrate 3 by using a solder of gold (Au) and tin (Sn), for example. Further, a lid is fixed to an upper surface of the frame body 5 so as to seal the inside hermetically, if required. In the bonding process, the package 10 is heated to about 280 to 300° C. Accordingly, the remelting temperature of the joining portion 13 is desired to be more than or equal to 300° C. As the temperature difference between a bonding temperature and the remelting temperature (melting point) of the joining portion 13 becomes larger, the manufacture is stable more.

When a silver solder which is widely used as a joining material is employed, for example, bonding of an electronic component can be carried out stably against a bonding temperature since the melting point of the silver solder is more than or equal to 780° C. However, when the substrate 3 is made of a copper alloy, the frame body 5 is made of a kovar, and the substrate 3 and the frame body 5 are joined using a silver solder, warp or strain is large due to the difference between the linear thermal expansion coefficients of the substrate 3 and the frame body 5 during the cooling process of the silver solder, the substrate 3 and the frame body 5. It is because the melting point of the sliver solder is high, As a result, when the package 10 which contains a semiconductor element is attached to a mount board, a gap is created between the rear surface 3b of the substrate 3 and the mount board, which lowers performance of heat dissipation. Further, when one of the substrate 3 and the frame body 5 is formed of ceramics, a crack may be produced.

According to the embodiment, the joining portion 13 can be formed by a liquid phase diffusion of copper and tin. The liquid phase diffusion of copper and tin is caused within a temperature range of 250 to 300° C., which allows forming the joining portion 13 at a temperature lower than that of the silver solder. When the joining portion 13 is formed by such a method, warp or strain of the substrate 3 and the frame body 5 can be suppressed. The melting point of a chemical compound formed by a liquid phase diffusion of copper and tin is 750° C., for example, which is substantially the same as the melting point of a silver solder. Accordingly, the chemical compound is stable against a bonding temperature for an electronic component and an operating temperature of the electronic component.

Figure 2A:
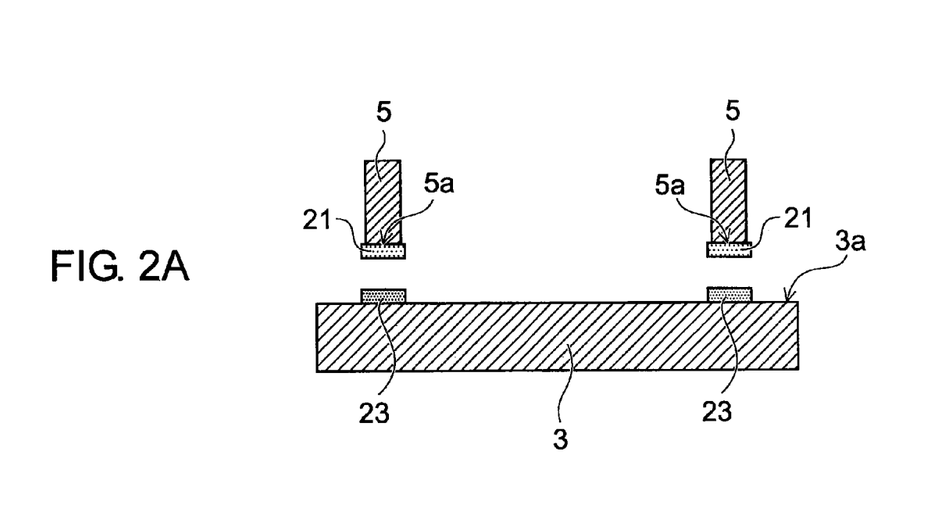
FIGS. 2A and 2B are schematic cross-sectional views illustrating a forming process of the package according to the first embodiment.
Figure 2B:
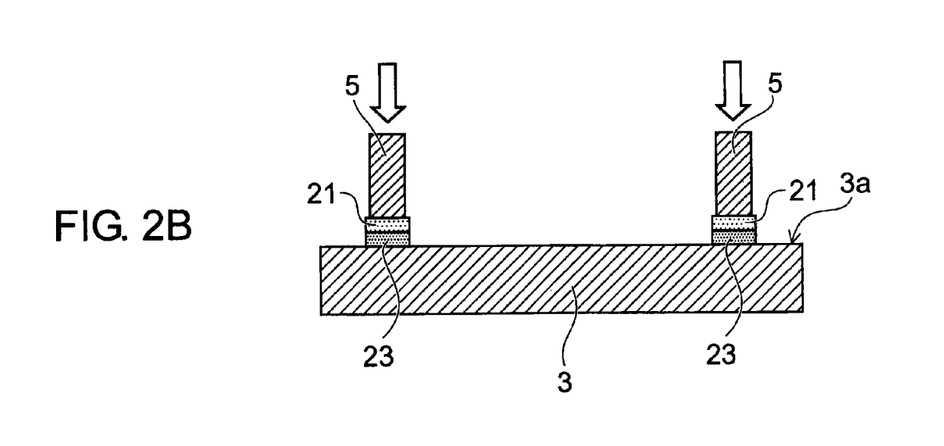

Hereinafter, examples of forming process of the joining portion 13 and examples of the structure of the joining portion 13 will be described in detail. FIGS. 2A and 2B are cross-sectional views schematically illustrating an example of forming process of the package 10. FIGS. 3A to 3C, FIGS. 4A to 4C, FIGS. 5A to 5C, and FIGS. 6A to 6C are schematic cross-sectional views respectively illustrating examples of forming process of the joining portion 13.

In a manufacturing process of the package 10, the substrate 3 as the first member and the frame body 5 as the second member are prepared. As illustrated in FIG. 2A, a joining metal layer 21 is provided on a joining surface 5a of the frame body 5. The joining metal layer 21 is a metal layer of at least one metal of a low melting point among tin (Sn), indium (In) or zinc (Zn). On the other hand, a second joining metal layer 23 containing copper is provided on the surface 3a of the substrate 3. When the substrate 3 is made of a copper, or a copper alloy containing copper as a main component, the joining metal layer 23 may be omitted.

As illustrated in FIG. 2B, the surface portion of the substrate 3 containing copper or the second joining metal layer 23 is brought into contact with a surface of the joining metal layer 21 formed on the frame body 5. A load is applied between the substrate 3 and the frame body 5 while maintaining contact of the substrate 3 and the frame body 5 with each other. Under this state, the substrate 3 and the frame body 5 are heated and maintained within a temperature range of 250 to 300° C. The metal of the low melting point contained in the joining metal layer 21 is melted by the heating so that the metal is diffused from the joining metal layer 21 in liquid phase state to a surface portion of the second joining metal layer 23 containing copper. In the example illustrated in FIG. 2B, the metal of the low melting point is diffused into the joining metal layer 23.

The joining metal layer 21 may be formed using a vacuum deposition, a sputtering, or plating. On the other hand, the joining metal layer 23 may be formed by sputtering copper on a surface of the substrate 3 and patterning a deposited copper layer to a predetermined shape. Further, adhesion layers containing titanium or nickel may be provided, respectively, between the joining metal layer 21 and the frame body 5, and between the joining metal layer 23 and the substrate 3, in order to strengthen adhesion.

Figure 3A:
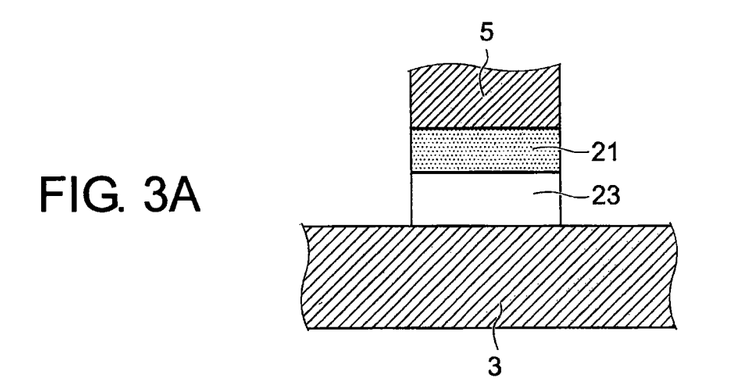
FIGS. 3A to 3C are schematic cross-sectional views illustrating a forming process of a joining portion of a joined structural body provided in the first embodiment.
Figure 3B:
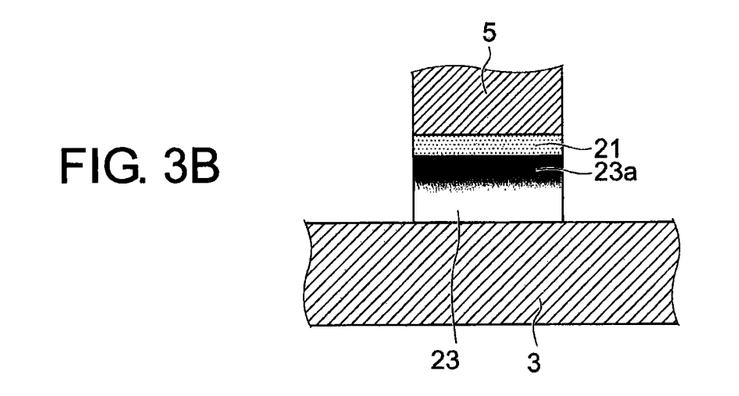
Figure 3C:
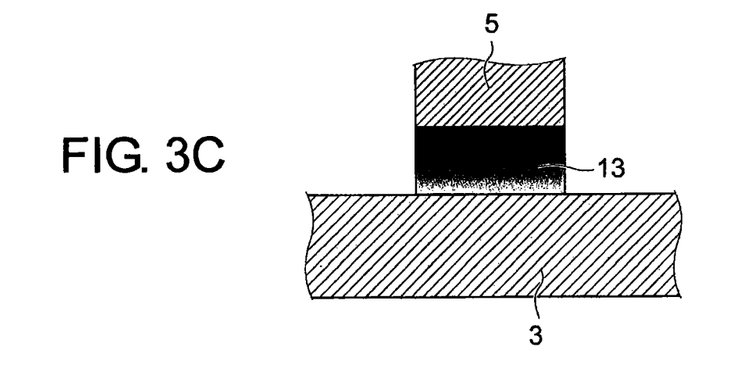

FIGS. 3A to 3C are enlarged partial and cross-sectional views illustrating a process of forming the joining portion which constitutes the joined structural body between the substrate 3 and the frame body 5. As illustrated in FIG. 3A, a surface of the joining metal layer 21 is brought into contact with a surface of the joining metal layer 23, and a load is applied so as to maintain the contact of the joining metal layers 21, 23 with each other.

Then, the substrate 3 is heated, and the temperature of the joining metal layers 21, 23 is maintained within a range of 250 to 300° C., for example. As a result, as illustrated in FIG. 3B, the metal of the low melting point contained in the joining metal layer 21 is diffused into the joining metal layer 23 so that a diffusion region 23a is formed.

As illustrated in FIG. 3C, the contact state is further maintained for a predetermined period under the temperature of 250 to 300° C. so that the joining portion 13 is formed by fusion of the joining metal layers 21, 23. As a result, the substrate 3 and the frame body 5 are joined with each other via the joining portion 13. Desirably, all of the metal of the low melting point is diffused into the joining metal layer 23 so that any solid phase metal does not remain.

The joining portion 13 contains at least one metal of a low melting point among tin (Sn), indium (In) or zinc (Zn), and copper (Cu). The content of the metal of the low melting point decreases toward a side of the substrate 3, and the content of copper increases toward the side of the substrate 3.

For example, the joining metal layer 21 is made of a tin layer having a thickness of 4 μm, and the joining metal layer 23 is made of a copper layer having a thickness of 4 μm. The joining metal layers 21, 23 are brought into contact with each other. The joining metal layers 21, 23 are heated and maintained at 250° C. for about 30 minutes, for example. Under such a temperature, the joining portion 13 can be formed by diffusing tin into the joining metal layer 23 (a copper layer).

Figure 9:
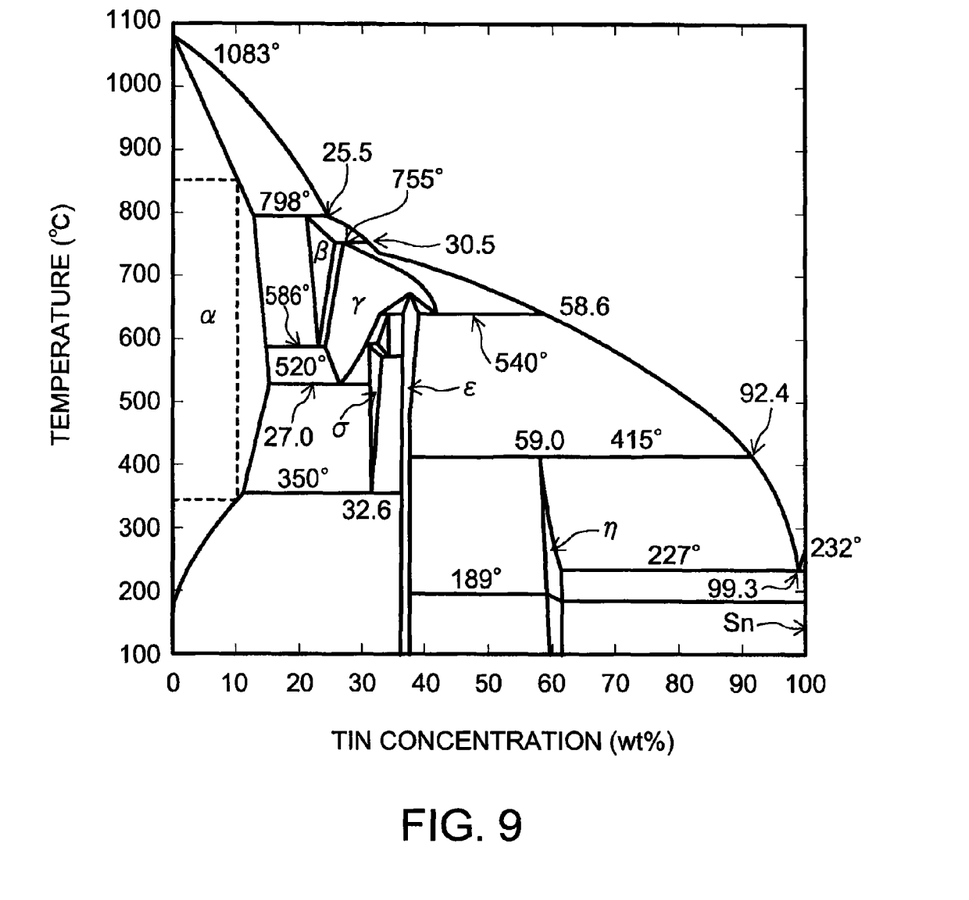
FIG. 9 is a two-element equilibrium diagram of copper and tin.

FIG. 9 shows a two-element equilibrium diagram of copper and tin. In FIG. 9, the vertical axis shows a temperature (° C.), and the horizontal axis shows a weight percentage (wt %) of tin. When the temperature of the joining metal layers 21, 23 is set to 250° C. which is higher than the melting point of tin i.e. 232° C., tin becomes a liquid phase state so that tin is diffused into the copper layer of a solid phase. Simultaneously, copper is diffused into the tin layer. As a result, copper and tin form a solid solution containing an α solid solution whose tin is less than or equal to about 15 wt %.

For example, when the solid solution is a composition containing copper of 90 wt % and tin of 10 wt % that is a composition indicated by a broken line extending vertically in FIG. 9, a large joining strength can be obtained without causing a phase change within a temperature range of about 330 to 820° C. Further, since a solid solution which is formed under the temperature range does not contain an inter-metallic compound (η layer) of $Cu_6Sn_5$ or an inter-metallic compound (ε layer) of $Cu_3Sn$, a juncture having a resistance against a shock can be formed.

The thicknesses of the joining metal layers 21, 23 are set in consideration of a joining time and a joining strength. For example, when the thickness of the joining metal layer 21 is small, the unevenness of the joining surface cannot be sufficiently suppressed so that voids may be created, resulting in weakening the joining strength. In contrast, when the thickness is too large, the joining process needs a long time, resulting in lowering the manufacturing efficiency. Desirably, the thickness of the joining metal layer 21 is less than or equal to 10 μm, and more than or equal to 2 μm.

Figure 4A:
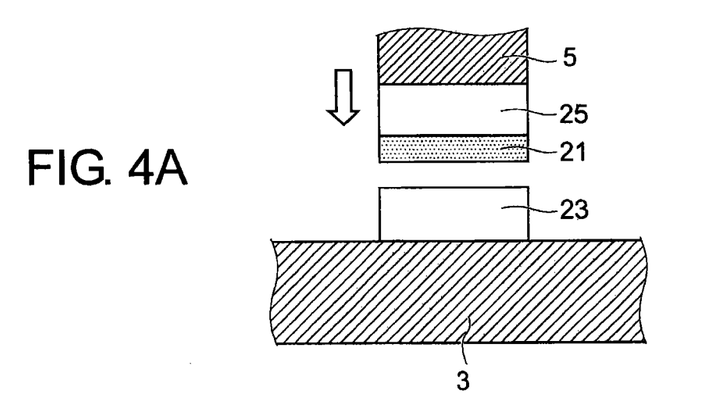
FIGS. 4A to 4C are schematic cross-sectional views illustrating a first modification of the forming process of the joining portion of the joined structural body.
Figure 4B:
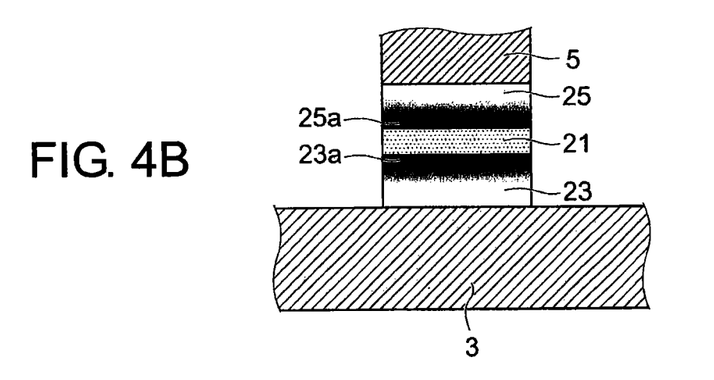
Figure 4C:
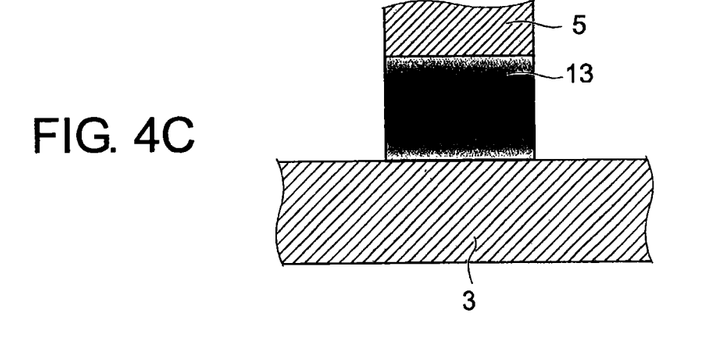

FIGS. 4A to 4C are enlarged partial and cross-sectional views illustrating a first modification of the forming process of the joining portion of the joined structural body according to the first embodiment. As illustrated in FIGS. 4A and 4B, the modification is different from the joined structure illustrated in FIGS. 3A and 4B in the point that a joining metal layer 25 is provided between a joining metal layer 21 and a frame body 5. The joining metal layer 25 is a metal containing copper. Further, an adhesion layer containing titanium or nickel may be provided between the joining metal layer 25 and the frame body 5.

As illustrated in FIG. 4B, a surface of the joining metal layer 21 and a surface of a joining metal layer 23 are brought into contact with each other, and maintained within a range of 250 to 300° C., for example. This step results in forming a region 23a where a metal of a low melting point is diffused from a front surface of the joining metal layer 21 into a side of a substrate 3, and results in forming a region 25a where the metal of the low melting point is diffused from a rear surface of the joining metal layer 21 into a side of a frame body 5.

Subsequently, as illustrated in FIG. 4C, a joining portion 13 is formed by fusing the joining metal layer 21 and the joining metal layers 23, 25. In the joining portion 13, a region containing a high proportion of the metal of the low melting point is formed at an intermediate position between the substrate 3 and the frame body 5. The proportion of the metal of the low melting point decreases toward both sides of the substrate 3 and the frame body 5, and the proportion of copper increases toward both sides of the substrate 3 and the frame body 5.

As schematically illustrated in FIG. 4C, the metal of the low melting point contained in the joining metal layer 21 is desired to be completely diffused so as to be integral with the joining metal layer 23 and the joining metal layer 25. However, the joined structure may be configured by a first layer containing copper provided on a side of the substrate 3, and a second layer containing copper provided on a side of the frame body 5.

Figure 5A:
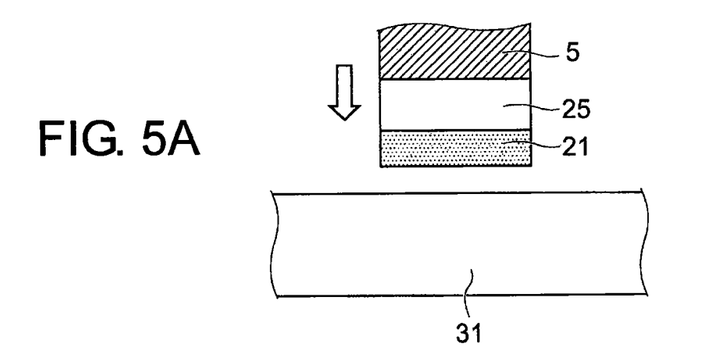
FIGS. 5A to 5C are schematic cross-sectional views illustrating a second modification of the forming process of the joining portion.
Figure 5B:
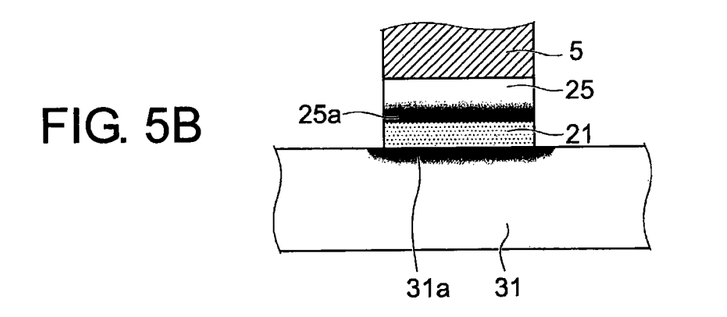
Figure 5C:
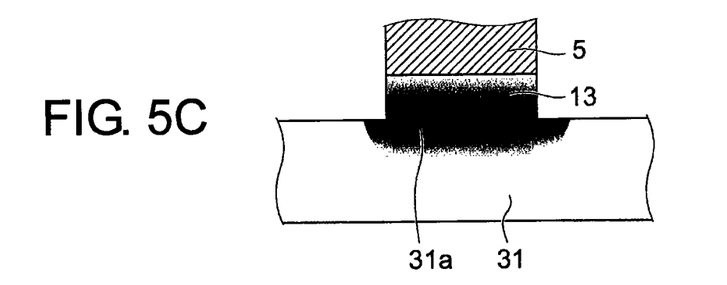

FIGS. 5A to 5C are enlarged partial and cross-sectional views illustrating a second modification of the forming process of the joining portion of the joined structural body according to the first embodiment. The modification is different from the forming process illustrated in FIGS. 3A to 3C in that any layer as the joining metal layer 23 is not provided on a surface of a substrate 31, and in that a joining metal layer 25 is provided between a joining metal layer 21 and a frame body 5 as illustrated in FIG. 5A. The substrate 31 is made of copper or an alloy containing copper as a main component.

As illustrated in FIG. 5B, a surface of the joining metal layer 21 and a surface of the substrate 31 are brought into contact with each other, and maintained within a range of 250 to 300° C., for example. The step results in forming a region 31a where a metal of a low melting point is diffused from a front surface of the joining metal layer 21 into the substrate 31, and results in forming a region 25a where the metal of the low melting point is diffused from a rear surface of the joining metal layer 21 into a side of the frame body 5.

Then, as illustrated in FIG. 5C, a joining portion 13 is formed by fusing the joining metal layer 21, the substrate 31 and the joining metal layer 25. In this case, the joining portion 13 becomes to have a region 31a which is formed by diffusing the metal of the low melting point into the substrate 31. In the joining portion 13, a region containing a high proportion of the metal of the low melting point is formed at an intermediate position between the substrate 31 and the frame body 5. The proportion of the metal of the low melting point decreases toward both sides of the substrate 31 and the frame body 5, and the proportion of copper increases toward both sides of the substrate 31 and the frame body 5.

In the modification, the joining metal layer 25 to be provided on the frame body 5 may be omitted. In this case, the joining portion 13 becomes to have a diffusion region 31a formed on the substrate 31, and the proportion of the metal of the low melting point decreases in the direction from the frame body 5 to the substrate 31, and the proportion of copper increases in the same direction.

Figure 6A:
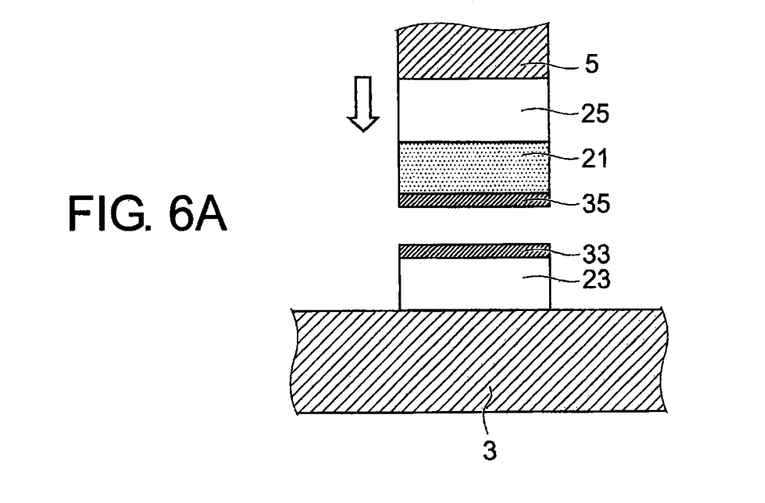
FIGS. 6A and 6B are schematic views illustrating a third modification of the forming process of the joining portion.
Figure 6B:
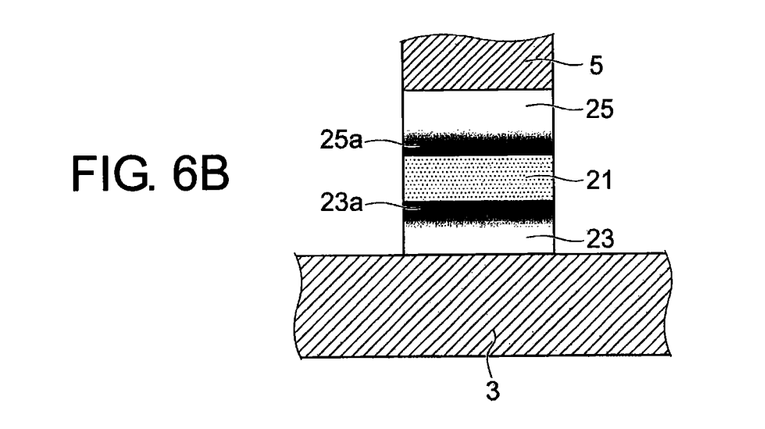

FIGS. 6A and 6B are enlarged partial and cross-sectional views illustrating a third modification of the forming process of the joining portion of the joined structural body according to the first embodiment. As illustrated in FIG. 6A, in the modification, a joining metal layer 25 is provided between a joining metal layer 21 and a frame body 5. Further, the modification is different from the forming process illustrated in FIGS. 3A to 3C in that protective metal layers 33, 35 are respectively provided on a surface portion of a substrate 3 containing copper i.e. a surface of a joining metal layer 23, and on a surface of the joining metal layer 21.

The metal of the low melting point contained in the joining metal layer 21 and the copper contained in the joining metal layer 23 are metals which are easy to be oxidized. When oxidized layers are formed on the surface of the joining metal layer 21 and the surface of the joining metal layer 23, the oxidized layers prevents diffusion of the metal of the low melting point from the joining metal layer 21 to the joining metal layer 23. The protective metal layers 35, 33 are formed on the respective surfaces of the joining metal layer 21 and the joining metal layer 23 in order to enhance the diffusion.

The protective metal layers 33, 35 may be made using gold (Au), or platinum (Pt). The protective metal layer 35 provided on the surface of the joining metal layer 21 and the protective metal layer 33 provided on the surface of the joining metal layer 23 are brought into contact with each other, and maintained in a range of 250 to 300° C., for example.

Under the temperature range, when the metal of the low melting point contained in the joining metal layer 21 is melted, the protective metal layers 33, 35 are introduced into the liquid phase. As illustrated in FIG. 6B, the step results in forming a region 23a where the metal of the low melting point is diffused from the surface i.e. a front surface of the joining metal layer 21 into the substrate 3, and results in forming a region 25a where the metal of the low melting point is diffused from a rear surface of the joining metal layer 21 to a side of the frame body 5.

The joining metal layers 23, 25 are maintained in a state of contacting with each other via the joining metal layer 21 so that a joining portion as the joining portion 13 shown in FIG. 4C can be formed by fusion of the joining metal layers 21, 23 and the joining metal layer 25.

The joining portion 13 contains a high proportion of the metal of the low melting point at an intermediate position between the substrate 3 and the frame body 5. The proportion of the metal of the low melting point decreases toward both sides of the substrate 3 and the frame body 5, and the proportion of copper increases toward both sides of the substrate 3 and the frame body 5. Further, the joining portion becomes to contain at least one of gold (Au) or platinum (Pt) which are introduced from the protective metal layers 33, 35.

Figure 7A:
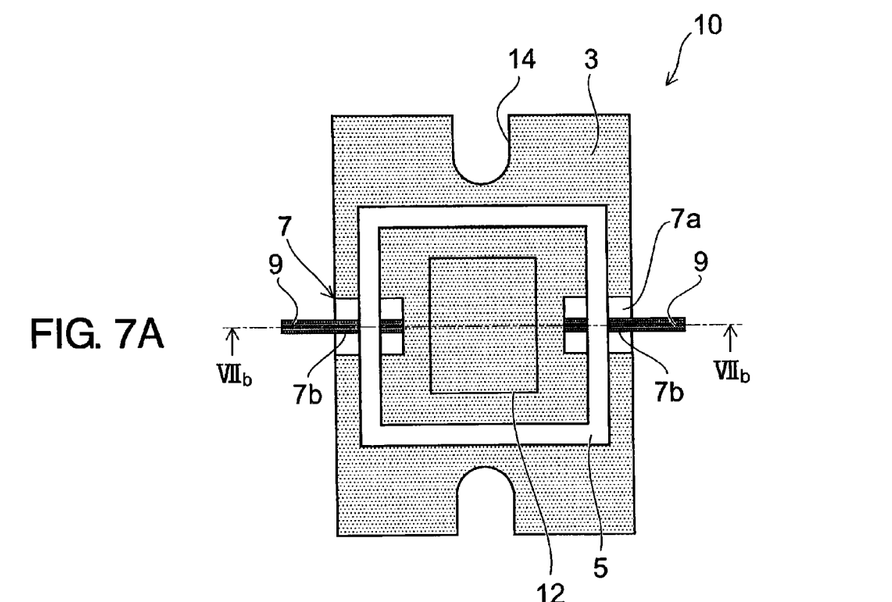
FIG. 7A is a schematic plan view illustrating a first modification of the package according to the first embodiment.
Figure 7B:
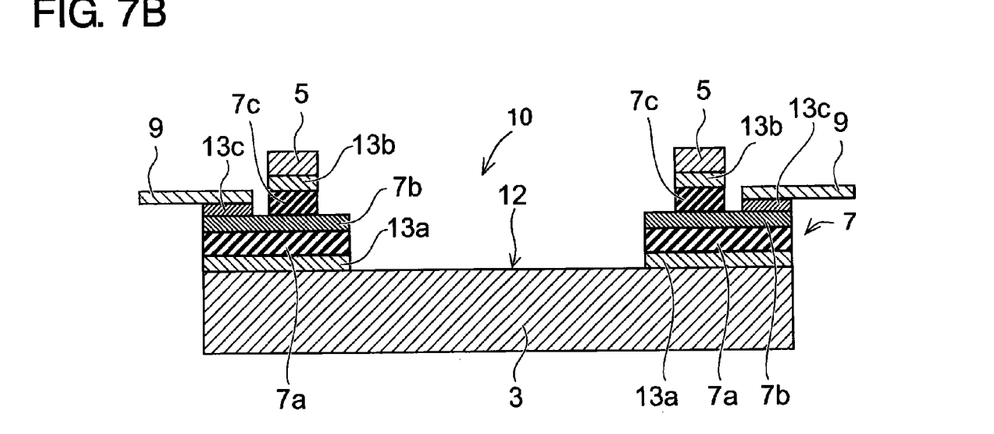
FIG. 7B is an enlarged cross-sectional view illustrating the first modification of the package according to the first embodiment schematically.

FIG. 7A is a schematic view illustrating a first modification of the package 10 according to the first embodiment. FIG. 7A is a plan view of the package 10, and FIG. 7B is an enlarged cross-sectional view taken along a VIIb-VIIb line in FIG. 7A. FIG. 7B illustrates a cross section which includes feed through terminals 7. As described above for the first embodiment with reference to FIGS. 1A and 1B, the feed through terminals 7 input signals into an electronic component (not shown) mounted to a component mounting portion 12 fixedly, and output signals from the electronic component. The electronic component and leads 9 are connected by conductive plates (not shown), for example.

As illustrated in FIG. 7A, in the feed through terminals 7, strip lines 7b are formed on insulating material layers 7a respectively, and the leads 9 are connected with the strip lines 7b respectively. The electronic component and the strip lines 7b are connected by via wires (or conductive plates or ribbons). The insulating material layers 7a are formed using ceramics such as alumina ($Al_2O_3$), for example. Further, the characteristic impedance of the strip lines 7b is set to be 50Ω so as to be matched with an external circuit. The matching can decrease transmission loss of high frequency signals between the electronic component and the external circuit.

Further, as illustrated in FIG. 7B, in the feed through terminals 7, an insulating material layer 7c is formed on the insulating material layers 7a via the strip lines 7b. The insulating material layer 7c insulates the strip lines 7b from the frame body 5 electrically.

In order to fix the feed through terminals 7 having the above-mentioned structure between the substrate 3 and the frame body 5, the substrate 3 and the feed through terminals 7 are connected via a joining portion 13a, and the frame body 5 and the feed through terminals 7 are joined via a joining portion 13b. As illustrated in FIG. 7B, the insulating material layers 7a of the feed through terminals 7 and the substrate 3 are joined via the joining portion 13a, and the insulating material layer 7c and the frame body 5 are joined via the joining portion 13b.

Further, conductive layers 13c are sandwiched between the strip lines 7b provided in the feed through terminals 7 and the leads 9. A lid (not shown) may be fixed to an upper surface of the frame body 5 so as to sealing the inside hermetically.

The joining portions 13a, 13b contain at least one metal of a low melting point among tin (Sn), indium (In), and zinc (Zn), and copper (Cu), respectively. In the joining portion 13a, the proportion of the metal of the low melting point decreases, and the proportion of copper increases, toward at least one of the insulating material layers 7a and the substrate 3. In the joining portion 13b, the proportion of the metal of the low melting point decreases, and the proportion of copper increases, toward at least one side of the insulating material layer 7c and the frame body 5.

As described above, the joined structural body described in the first embodiment is provided with a joining portion produced by diffusing at least one metal of a low melting point among tin (Sn), indium (In) or zinc (Zn) into a joining metal layer containing copper. The structure present a package which can suppress warp and strain.

The temperature for diffusing the metal of the low melting point is not limited to the range of 250 to 300° C., and may be different depending on the kind of the metal of the low melting point. For example, when indium is used, diffusion can be performed under a range of lower temperature, and in a case of using zinc, diffusion can be performed under a range of higher temperature.

Further, in the first embodiment mentioned above, a package which contains an electronic component is described as an example, but the package is not limited to such a package. For example, the invention can be applied to a so-called carrier of a structure that members having strip lines are joined to a substrate.

Further, in the first embodiment, at least one of the first member and the second member may be ceramics such as alumina ($Al_2O_3$) or aluminum nitride (AlN).

Figure 8A:
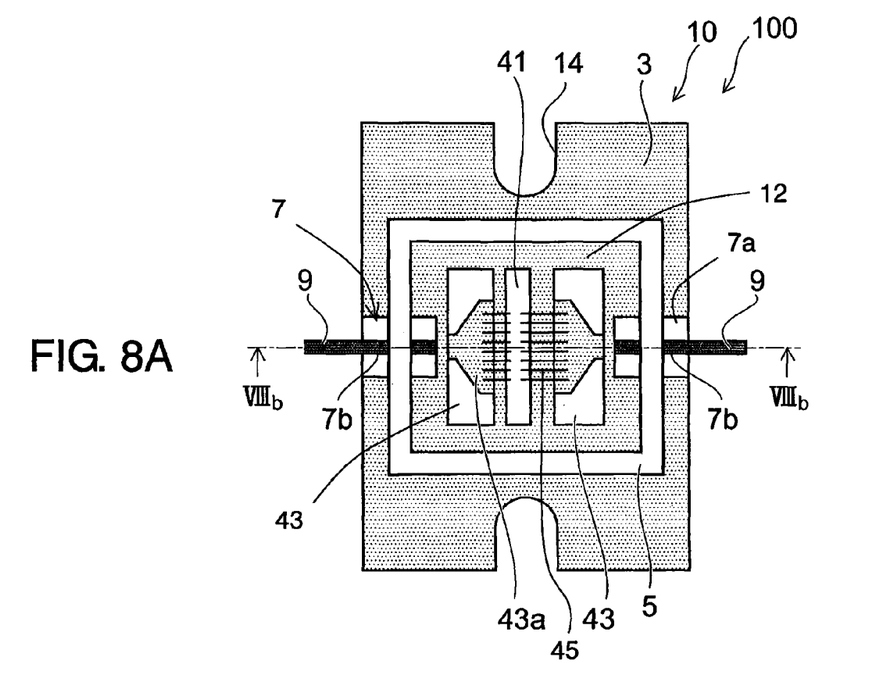
FIG. 8A is a schematic plan view illustrating a package according to a second embodiment.
Figure 8B:
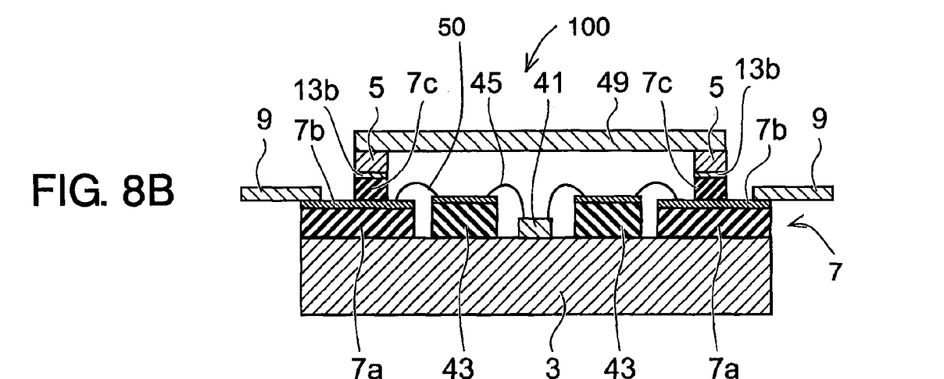
FIG. 8B is an enlarged cross-sectional view illustrating the package according to the second embodiment schematically.

FIGS. 8A and 8B are schematic views illustrating a package according to a second embodiment which is a semiconductor package. FIG. 8A is a plan view of the package, and FIG. 8B is an enlarged cross-sectional view taken along a VIIIb-VIIIb line illustrated in FIG. 8A.

In FIGS. 8A and 8B, a package 100 which is a semiconductor package contains a power transistor 41 for amplifying a high frequency signal as an electronic component. The power transistor may be a Hetero Junction Field Effect Transistor (HFET) which uses GaN or SiC as a constituent material, or a Lateral Double Diffuse MOS Transistor (LDMOS-FET) which uses silicon as a constituent material. Both of the power transistors are power amplification elements, and operate with a large amount of heat generation. Accordingly, for the substrate 3 of the package 10 on which such an element mounted, a copper plate or a copper alloy which performs good heat dissipation is employed.

As illustrated in FIG. 8A, a power transistor 41 and two circuit boards 43 are mounted on a component mounting portion 12 of the package 100. Patterned conductive layers 43a are formed on surfaces of the circuit boards 43 respectively. The patterned conductive layers 43a are electrically connected with a plurality of gate electrodes and a plurality of source electrodes (or drain electrodes) of the power transistor 41 via conductive wires 45. The patterned conductive layers 43a and strip lines 7b are electrically connected via wires 50 illustrated in FIG. 8B (or conductive plates or ribbons), respectively. The circuit boards 43 are made of alumina ($Al_2O_3$), for example.

As illustrated in FIG. 8B, the power transistor 41 and the circuit boards 43 are bonded to the substrate 3. The bonding may be carried out by using an AuSn solder. By the bonding, the power transistor 41 and the substrate 3 are electrically connected with each other so as to enhance heat dissipation. The power transistor 41 may be grounded via the substrate 3.

Further, a lid 49 is fixed on an upper surface of a frame body 5 so as to seal the transistor 41 hermetically. A nitrogen gas or a similar gas is filled in the inside of the package 100 so as to make the operation of the transistor 41 stable and to enhance the reliability of the transistor 41. The lid 49 is soldered to the frame body 5 using AuSn, for example.

In the package 100, insulating material layers 7a and an insulating material layer 7c are provided. The insulating material layers 7a are formed on the substrate 3. The insulating material layers 7a and the insulating material layer 7c sandwich strip lines 7b respectively. The insulating material layer 7c and the frame body 5 are joined via a joining portion 13b. The joining portion 13b may be formed by a liquid phase diffusion of tin and copper. Such a joining process is performed under a temperature lower than a temperature of silver soldering so that warp or strain of the substrate 3 and the frame body 5 can be suppressed. As a result, when a rear surface of the substrate 3 is adhered to a mount board or a heat sink, heat which is generated in the power transistor 41 can be efficiently dissipated. Accordingly, the operation of the power transistor can be stable, and the reliability of the power transistor can be enhanced.

An operation temperature of a transistor which uses a wide-gap semiconductor material such as GaN or SiC reaches 600° C. Even in such a case, the melting point of the joining portion where tin is diffused into copper is above the operation temperature so that the transistor can be stably operated.

The package 100 according to the embodiment is not limited to using the transistor mentioned above. A photo semiconductor element such as a LED or a laser element, or a piezo-electric element such as a SAW filter can be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A package containing an electronic component, comprising:
   a substrate on which an electronic component is mounted;
   a frame body which surrounds a portion on which the electronic component is mounted, the frame body being joined mechanically with the substrate via a joining portion containing (1) at least one metal of a tin, an indium, or a zinc, and (2) a copper: and
   feed through terminals for inputting a signal into the electronic component and for outputting a signal from the electronic component respectively,
   wherein content of the at least one metal in the joining portion decreases toward a side of at least one of the substrate or the frame body, and content of the copper in the joining portion increases in a same direction as the decreasing direction of the content of the at least one metal, and
   wherein the joining portion includes a first joining portion and a second joining portion, and the substrate and the feed through terminals are joined together via the first joining portion, and the frame body and the feed through terminals are joined together via the second joining portion.

2. The package according to claim 1, wherein
   the content of the metal decreases toward both sides of the substrate and the frame body, and
   the content of the copper increases toward both sides of the substrate the frame body.

3. The package according to claim 1, wherein the joining portion includes a first layer containing a copper which is provided on aside of the substrate, and a second layer containing a copper which is provided on a side of the frame body.

4. The package according to claim 1, wherein the joining portion contains at least one of a gold or a platinum.

5. The package according to claim 1, wherein at least one metal of tin, indium, or zinc and copper contained in the joining portion form a solid solution containing an a solid solution.

6. The package according to claim 1, wherein the at least one metal is tin and the weight percentage of tin is less than or equal to 15.

7. The package according to claim 1, wherein the weight percentage of tin is 10.

8. The package according to claim 1, wherein the frame body contains iron.

9. The package according to claim 1, wherein the frame body is an alloy containing iron, nickel, and cobalt.

10. The package according to claim 1, wherein the substrate contains copper and the first joining portion is formed on the substrate.

* * * * *